United States Patent [19]

Brilka et al.

[11] Patent Number: 4,945,313
[45] Date of Patent: Jul. 31, 1990

[54] SYNCHRONOUS DEMODULATOR HAVING AUTOMATICALLY TUNED BAND-PASS FILTER

[75] Inventors: Joachim C. Brilka; Wolfgang Weltersbach, both of Hamburg, Fed. Rep. of Germany

[73] Assignee: U.S. Philips Corporation, New York, N.Y.

[21] Appl. No.: 361,210

[22] Filed: Jun. 5, 1989

[30] Foreign Application Priority Data

Jun. 8, 1988 [DE] Fed. Rep. of Germany ....... 3819460
Jun. 8, 1988 [DE] Fed. Rep. of Germany ....... 3819461

[51] Int. Cl.⁵ .......................... H03D 1/22; H04N 5/62
[52] U.S. Cl. ..................................... 329/349; 329/358; 329/363; 358/25; 455/312; 455/337
[58] Field of Search ............... 329/349, 358, 363, 364, 329/336, 337, 365, 366; 455/307, 309, 312, 337; 358/23, 24, 25

[56] References Cited

U.S. PATENT DOCUMENTS

| 4,079,330 | 3/1978 | Ishigaki et al. | 329/336 X |
| 4,163,196 | 7/1979 | Hongu et al. | 329/358 |
| 4,307,347 | 12/1981 | Thomson | 329/358 |

FOREIGN PATENT DOCUMENTS 2814522 10/1978 Fed. Rep. of Germany .
2843977 4/1980 Fed. Rep. of Germany .

*Primary Examiner*—Siegfried H. Grimm
*Attorney, Agent, or Firm*—Edward W. Goodman

[57] ABSTRACT

In a synchronous demodulator for demodulating a carrier signal modulated with a useful signal, the demodulator including a filter circuit (2) for selecting the carrier signal, a limiter (3) for generating an amplitude-limited reference signal from the carrier signal, a phase shifter (4) for shifting the phase of the reference signal through a phase angle of essentially 90° with respect to the carrier signal, and a multiplier (5) for multiplicatively combining the modulated carrier signal with the phase shifted reference signal, a simple arrangement effectively suppresses interference phase modulations, in that a dc mixing product is supplied (via 8) by the multiplier (5) as a measure of the frequency deviation of the carrier signal from the pass frequency of the filter circuit (2) as a control signal to this filter circuit for the purpose of controlling the pass frequency.

10 Claims, 2 Drawing Sheets

SYNCHRONOUS DEMODULATOR HAVING AUTOMATICALLY TUNED BAND-PASS FILTER

BACKGROUND OF THE INVENTION

1. Field of the Invention

The invention relates to a synchronous demodulator for demodulating a carrier signal modulated with a useful signal, this demodulator comprising a filter circuit for separating the carrier signal, a limiter for generating an amplitude-limited reference signal from the carrier signal, a phase shifter for shifting the phase of the reference signal through a phase angle of essentially 90° with respect to the carrier signal, and a multiplier for multiplicatively combining the modulated carrier signal with the reference signal.

2. Description of Related Art

A circuit arrangement for gaining sound signals from a television signal is known from German Patentschrift DE-PS No. 28 43 977, in which this television signal is applied via an amplifier to a filter circuit tuned to the IF picture carrier signal and is subsequently applied to a limiter amplifier for the purpose of gaining a reference signal for the demodulation. The filter circuit filters the IF picture carrier signal with a part of the neighboring signals transmitted as double sideband signals. The signals thus filtered are considerably limited in amplitude in the limiter amplifier in such a way that the amplitude modulation produced by the sidebands is substantially eliminated and a reference signal corresponding to the IF picture carrier signal is available at the output of the limiter amplifier, this reference signal being applied to a single sideband mixer stage. Moreover, the phase is shifted by 90° in this signal path for the purpose of gaining the reference signal. The mixer stage also receives the signal comprising the picture IF signal, this signal being also applied to the amplifier and to the filter circuit. In the mixer stage, which may be part of a phase discriminator, the sound signal comprises in the picture IF signal is demodulated with the reference signal obtained at the output of the limiter amplifier.

In this circuit arrangement, the signals passed through the filter circuit 29 are limited to a range around the IF picture carrier signal. For this purpose the filter circuit may be constituted by a single circuit having a quality of 50 to 80. Provided that the amplitude distribution of the vestigial sidebands passed by the filter circuit is at least substantially symmetrically situated around the frequency of the IF picture carrier, the vestigial sidebands only affect an amplitude modulation of the IF picture carrier. In the case of an asymmetrical amplitude distribution, the IF picture carrier also has an interference phase modulation. While the (remaining) amplitude modulation is substantially eliminated by the limiter amplifier, the interference phase modulation remains unchanged and reaches the mixer stage in which it causes distortions in the demodulated signal.

SUMMARY OF THE INVENTION

It is an object of the invention to provide a simple circuit arrangement by which the described interference phase modulations can be suppressed.

In a synchronous demodulator of the type described in the opening paragraph, this object is solved in that a direct voltage supplied as a combination product by the multiplier as a measure of the frequency deviation of the carrier signal from the pass frequency of the filter circuit can be applied as a variable to this filter circuit for the purpose of controlling the pass frequency.

It has been found that an essential part of the interference phase modulation of the reference signal originates from a deviation between the intermediate frequency of the pass region of the filter circuit and the frequency of the carrier signal and hence the reference signal. Such a deviation is particularly caused by manufacturing tolerances and ageing processes in the described synchronous demodulator and hence in circuit arrangements operating in conjunction with this demodulator. The state of the art filter circuit has only an average quality, i.e. a bandpass curve which has a relatively flat frequency response so as to keep the effects of the deviations described within acceptable limits. However, a compromise is required between the selectivity of the filter circuit and the remaining amplitude modulations and the interference phase modulation.

In contrast to the above, the invention has the advantage that the interference phase modulation is substantially excluded by means of a simple arrangement. The filter circuit may then, without any drawback, be dimensioned for a higher selectivity so as to even further suppress the amplitude modulation. This leads to a reference signal which is very stable in amplitude having the correct phase and which does not introduce any noticeable interference in the demodulated useful signal.

The invention advantageously utilizes the fact that in the case of multiplexing of the frequency-modulated carrier signal with the reference signal which is shifted 90° in phase with respect thereto, the multiplier supplies, apart from other mixing products, also a direct voltage whose value is directly a measure of the frequency deviation of the carrier signal from the pass frequency of the filter circuit. In fact, very simple circuit-technical means then provide the possibility of applying this direct voltage as a control voltage or adjusting voltage to the filter circuit for controlling its pass frequency. Particularly for this purpose, the filter circuit includes a tunable element, preferably comprising at least one tunable capacitance to which the direct voltage for controlling the pass frequency can be applied.

The composition and amplitudes of the mixing products of the multiplier are dependent on the phase angle between the carrier signal and the reference signal. If a synchronous demodulator is required, which is to supply the combination products of the modulated carrier signal and the reference signal in the case of a phase angle of essentially 0°, this can be simply achieved according to a further embodiment of the invention by means of a further multiplier to which the reference signal in phase with the modulated carrier signal can be applied for gaining the baseband useful modulation signal of the modulated carrier signal. In this arrangement a multiplier is only used for gaining the control signal for controlling the pass frequency of the filter circuit while the second multiplier is only used for demodulating the useful signal. The filter circuit and limiter are common for the two multipliers.

In the arrangement described in German Patentschrift DE-PS No. 28 43 977, which operates in accordance with the quasi-parallel sound method, interference modulations from the picture carrier to the sound carrier occur particularly because the quasi-parallel sound filter passes a frequency band of a certain width around the picture carrier signal. Particularly disturbing are residues of the picture signal occurring as sidebands of the picture carrier modulation, which have a frequency spacing from the picture carrier corresponding to the spacing of the sound carrier from the picture carrier. Non-linearities in the transmission characteristics of the separate stages of the demodulation arrangement described then mix certain parts of the picture signal in the frequency of the sound carrier modulation signal and lead in situ to picture content-dependent interferences of the sound signal. In the so-called B/G system, these are particularly picture signal residues with a frequency which is spaced 250 kHz from the picture carrier signal, while a frequency spacing of 350 kHz occurs in systems with digital sub-carriers such as, for example, "NICAM-B/G".

It is true that it is fundamentally possible to linearize the transmission characteristics of the controllable amplifier and the further amplifier by increasing the number of circuit components, but the non-linearity of the limiter amplifier, which is absolutely required for suppressing the amplitude modulation of the picture carrier signal, and moreover the necessarily non-linear transmission characteristic of the mixer stage remain, however, necessary.

To provide a simple circuit arrangement by which the described interference modulations of the sound carrier are reduced to such an extent that they are no longer audible in the sound signal, also in the case of the most unfavorable, i.e. interference-sensitive form of the residual modulation of the picture carrier, the filter circuit in a further embodiment of the synchronous demodulator according to the invention has a transmission minimum (zero) at the frequency of the sound carrier.

The sound carrier for the subsequent signal processing is thus advantageously suppressed, and thereby the described interference modulations are eliminated. A condition for this is that a pre-amplifier, which may be present and which supplies the filter circuit, has a transmission characteristic of adequate linearity so as to avoid interference modulations of a comparatively large amplitude in the signal path before the filter circuit, because these occur in a frequency range in which the transmission minimum may no longer be active.

It has been found that the larger number of components for linearizing the transmission characteristic of the pre-amplifier, particularly for a structure within an integrated circuit, can be kept within limits by an improved manufacturing process and an optimized circuit structure. The preferred embodiment of the invention combines said advantage with a filter circuit having a very simple structure, because the transmission minimum in the bandpass curve of the filter circuit, particularly a zero position or a frequency range having a small signal transmission, can be formed with a very small number of circuit components. A very good suppression of the interference modulation is then achieved; also in the case of the very unfavorable 250 kHz picture signal residues (vestigial sidebands) of the picture carrier, this interference modulation is no longer audible.

In this respect, it is to be noted that intercarrier demodulation arrangements for demodulating two sound signal carriers are known from "Fernseh- und Kinotechnik", vol. 41, no. 6, 1987, pages 251 etc., and from the apparatus type AMF 2-E32 of the Firm of Rohde und Schwarz, described in the associated Handbook, Edition R38959 of Mar. 1981, which arrangements comprise, for each sound signal carrier, a separate arrangement each including an amplifier, a limiter and an intercarrier mixer. These arrangements precede specially adapted filters which pass, each time, the picture carrier and only one of the two sound carriers. On the other hand, in the demodulation arrangement according to the invention, the number of circuit components is reduced to at least half the total number for a comparable suppression of the interference modulation.

Furthermore, a demodulation arrangement is known from German Offenlegungsschrift DE-OS No. 28 14 522, corresponding to U.S. Pat. No. 4,163,196, which includes a carrier-deriving circuit with a tuned circuit for deriving a carrier from an applied, amplitude-modulated IF signal. This circuit is formed as a notch filter from the series arrangement of parallel resonant circuits. It selects the carrier from the IF signal and suppresses a sound signal component of the IF signal (amplitude-modulated television signal).

In a synchronous demodulator in which the filter circuit comprises a suppression filter which bridges an operating impedance of the pre-amplifier, the transmission minimum is advantageously constituted by at least one series capacitor arranged in series with the suppression filter. The described variation of the bandpass curve of the filter circuit is thereby attained by addition of a simple component to the conventional suppression filter. In this case it is harmless that the filter circuit acquires an additional transmission maximum at low frequencies due to the series capacitor, because these frequencies are suppressed by preceding and succeeding filters.

In this respect it is to be noted that it is known in principle from "Funkschau" 1976, no. 10, page 397 to suppress sideband harmonics, caused by video detection, with a fundamental frequency around 1.7 and 2.7 MHz below the picture carrier with the aid of a parallel-series circuit (three-point circuit). This three-point circuit comprises a parallel circuit of an inductance and a capacitance arranged in series with a further capacitance to which a choke is connected in parallel. The measure described in this literature is only active when gaining the modulated sound carrier signal by a common demodulation with the picture signal in the video detector.

In the synchronous demodulator according to the further embodiment described hereinbefore, those parts of the television signal are suppressed in the signal processing branch constituted by the filter circuit and the limiter, which are transmitted in a preferably undistorted form by the quasi-parallel sound filter and a pre-amplifier for the useful signal, because they comprise sound signals to be demodulated finally. Fundamentally, such a suppression can also be achieved by a filter circuit of high quality or an appropriate bandpass filter. However, whereas the bandpass filter involves a larger number of circuit and adjusting components, a (single-circuit) filter of high quality has a very narrow bandpass range for the picture carrier signal. This leads to a satisfactory separation of the vestigial sidebands from the picture carrier signal, while the measures according to the invention compensate for the aging processes or manufacturing or adjusting tolerances which lead to a shift between the bandpass maximum value and the frequency of the picture carrier signal.

BRIEF DESCRIPTION OF THE DRAWINGS

With the above and additional objects and advantages in mind as will hereinafter appear, the invention will be described with reference to the accompanying drawings, in which.

DESCRIPTION OF THE PREFERRED EMBODIMENTS

Figure 1:
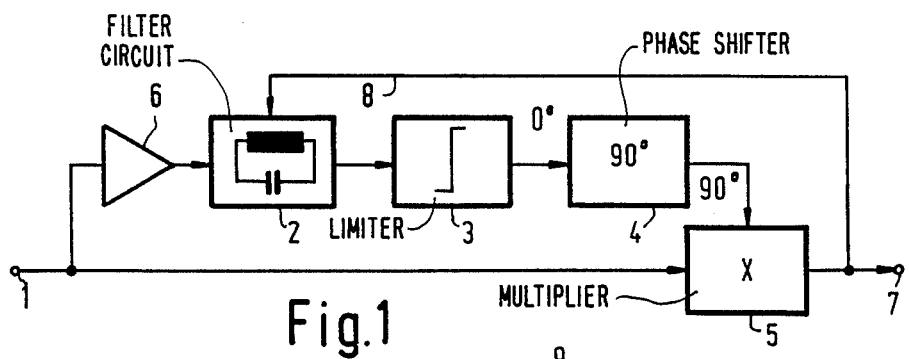
FIG. 1 is a block diagram of a first embodiment of the invention.

FIG. 1 is a block diagram of an embodiment of a synchronous demodulator according to the invention. In this demodulator a carrier signal modulated with a useful signal is applied from an input 1 to an input of a multiplier 5 via a band-pass filter circuit 2, a limiter 3 and a phase shifter 4, on the one hand, and directly, on the other hand. Optionally, the signal path between the input 1 and the filter circuit 2 may also incorporate a pre-amplifier 6. In the filter circuit 2, the (possibly amplified) modulated carrier is at least substantially liberated from its frequency-adjacent modulation frequency components; i.e. the carrier signal is only filtered with a part of the adjacent sidebands modulated on this carrier. The degree of suppression is determined by the shape of the band-pass curve, i.e. the characteristic of the filter circuit 2. To minimize the number of circuit components for the filter circuit 2, its selectivity is generally limited so that a considerable part of the sidebands of the modulated carrier passes the filter circuit 2.

In the subsequent limiter 3, the carrier signal is amplified together with the remaining vestigial sidebands and limited to a predetermined amplitude so that an amplitude-limited, substantially rectangularly varying reference signal is supplied at the output of the limiter 3. In the relevant embodiment it has been assumed for the sake of simplicity that the reference signal is in phase with the carrier signal at the input 1. However, in practice, phase shifts occur in the filter circuit 2 and in the limiter 3. These shifts can be compensated by additional circuit elements, which have been omitted in FIG. 1 for the sake of clarity, so that the carrier signal supplied from the input 1 to the multiplier 5 is in phase with the reference signal supplied by the limiter 3.

In a phase shifter 4 succeeding the limiter 3, the reference signal is shifted 90° in phase. In this phase position, the reference signal is applied to the multiplier 5 and combined multiplicatively in this multiplier with the modulated carrier signal. A useful control signal then essentially appears at the output 7 of the multiplier 5.

Instead of compensating for the phase shifts in the filter circuit 2 and in the limiter 3, they can be arranged for a total phase shift of 90°, possibly by means of a phase shifter adapted thereto. In that case additional circuit elements are required to bring the carrier signal from the input 1 in phase with the reference signal.

In the case of exact dimensioning and exact adjustment of the synchronous demodulator described, the maximum of the band-pass curve, i.e. the transmission maximum of the filter circuit 2 is exactly at the carrier frequency. However, manufacturing tolerances, ageing processes or also a desired fine tuning of the frequency of the carrier signal may produce deviations between the frequency of the carrier signal and the frequency at which the band-pass curve is at its maximum. As a result the carrier signal is attenuated more considerably by the filter circuit 2, on the one hand, while, on the other hand, said maximum falls within the range of the sidebands of the modulated carrier which are consequently transmitted to a partly stronger extent than the carrier itself, but particularly with a different amplitude. The output signal of the filter circuit 2 also exhibits an additional interference phase modulation which is not suppressed by the subsequent limiter 3 and is thus introduced in an unchanged form into the demodulated useful signal via the multiplier 5.

The exact composition of the signal at the output 7 of the multiplier 5 is dependent, inter alia, on the phase angle between the reference signal and the carrier signal. If this angle has a value of 90°, as is shown in FIG. 1, inter alia a direct voltage is produced as a mixing product at the output 7, this voltage having a value which is at least substantially proportional to the deviation of the carrier frequency from the frequency of the band-pass maximum of the filter circuit 2 in a given frequency interval around the frequency of the carrier signal. According to the invention, this direct voltage is applied via a lead 8 to the filter circuit 2 as a control voltage, i.e. as a variable for controlling the frequency of the band-pass maximum, i.e. the pass frequency. As a result a deviation of this pass frequency from the frequency of the carrier signal is at least substantially avoided, a reference signal which is free from phase shifts being achieved.

Figure 2:
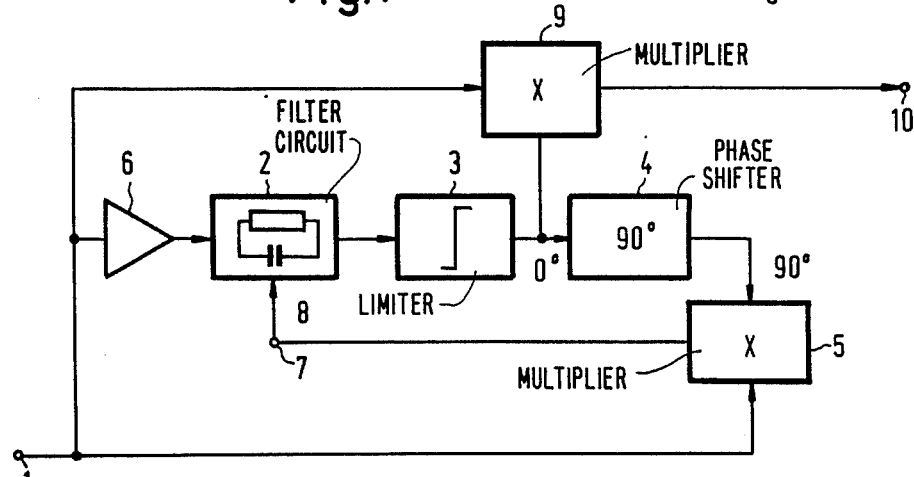
FIG. 2 shows a block diagram of a second embodiment of the invention which is a modification of the block diagram of FIG. 1 providing in-phase demodulation of the modulated carrier signal.

FIG. 2 shows a modification of the circuit arrangement according to FIG. 1 which is provided for realizing an in-phase demodulation of the modulated carrier signal, i.e. for the case where the carrier signal is to be demodulated with a reference signal which is in phase therewith. The arrangement according to FIG. 2 comprises that of FIG. 1, while corresponding components have the same reference numerals. Additionally, the arrangement according to FIG. 2 includes a further multiplier 9 to which the reference signal in phase with the modulated carrier signal is applied and is multiplied therewith. The mixing products of this in-phase demodulation are supplied at the output 10 of the multiplier 9. A useful control signal is derived from the output 7.

Figure 3:
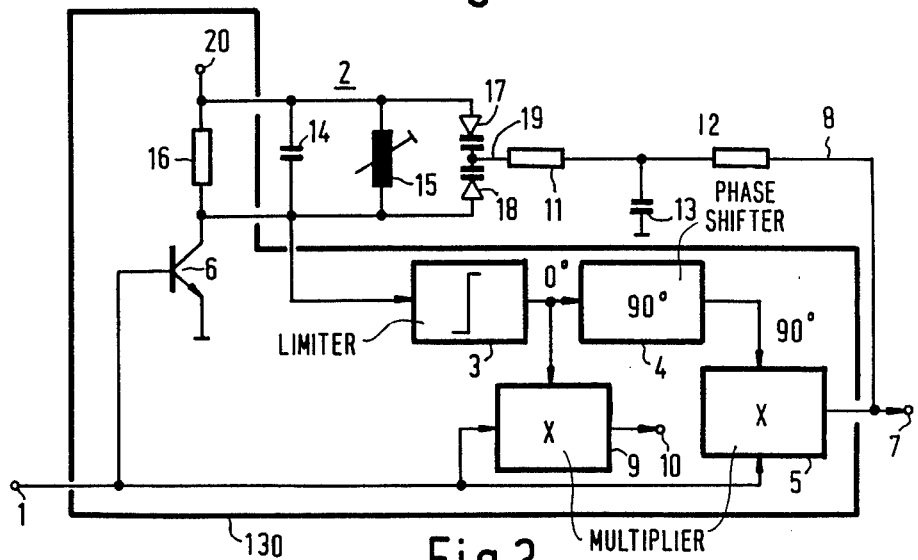
FIG. 3 shows the second embodiment of FIG. 2 in greater detail.

FIG. 3 shows an embodiment of the synchronous demodulator according to FIG. 2 in slightly greater detail, while corresponding circuit components again have the same reference numerals. The circuit arrangement according to FIG. 1 can be formed in a corresponding manner. The useful control signal is applied to the filter circuit 2 from the output 7 via a low-pass filter constituted by two series resistors 11, 12 and one shunt capacitance 13. This filter circuit 2 comprises a wave trap or notch constituted by a capacitance 14 and an inductance 15 which is adjustable for adjusting the filter circuit 2. The wave trap 14, 15 shunts an operating resistor 16—in this case a collector resistor—of the pre-amplifier 6 formed as a transistor. It is tuned to the frequency of the carrier signal so that the operating resistor 16 and hence the pre-amplifier 6 are only or essentially only operative at this frequency.

For controlling the pass frequency, the filter circuit 2 also comprises two capacity diodes 17, 18 which are oppositely arranged in series and parallel to the capacitance 14, the central tapping 19 of said capacity diodes receiving the direct voltage from the line 8 via the low-pass filter 11, 12, 13. The capacitances of the capacity diodes 17, 18 are determined by the difference between the direct voltage on the line 8 and the d.c. supply voltage at the d.c. terminal 20 connected to the filter circuit 2.

In a further embodiment, which is not shown, the filter circuit 2 may comprise a reactance circuit changing the band-pass curve, instead of the capacity diodes 17, 18; this reactance circuit may imitate both a variable capacitance and a variable inductance. This reactance circuit may be preferably integrated on a semiconductor crystal, together with the other circuit components. The arrangement according to the invention for controlling the pass frequency is thus compact and can be built without any additional circuit components and additional adjustment. In such a construction variable capacitances are preferably constituted by junction capacitances of transistors or the like.

Optionally it is also possible to form the inductance of the filter circuit 2 as a tunable coil, for example with a non-linear magnetic core, while the value of the inductance of this coil for small signal modulation can be adjusted by means of a direct current, i.e. by means of a pre-magnetization.

The filter circuit 2 in FIG. 3 shows a very simple embodiment to explain the principal operation of the circuit arrangement. With corresponding modifications, it is also possible to use filter circuits having different band-pass curves.

Figure 4:
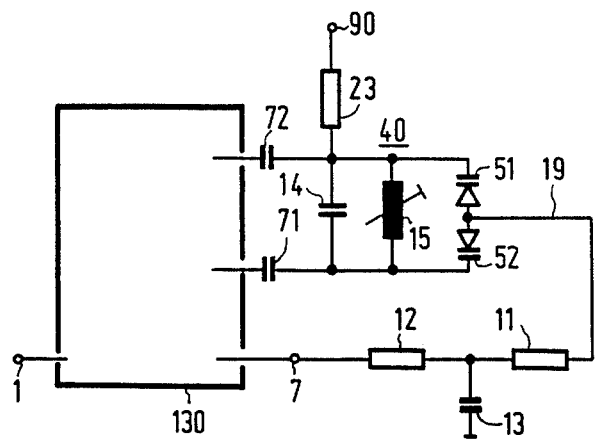
FIG. 4 shows a third embodiment of the invention which is a modification of the block diagram of FIG. 3.
Figure 5:
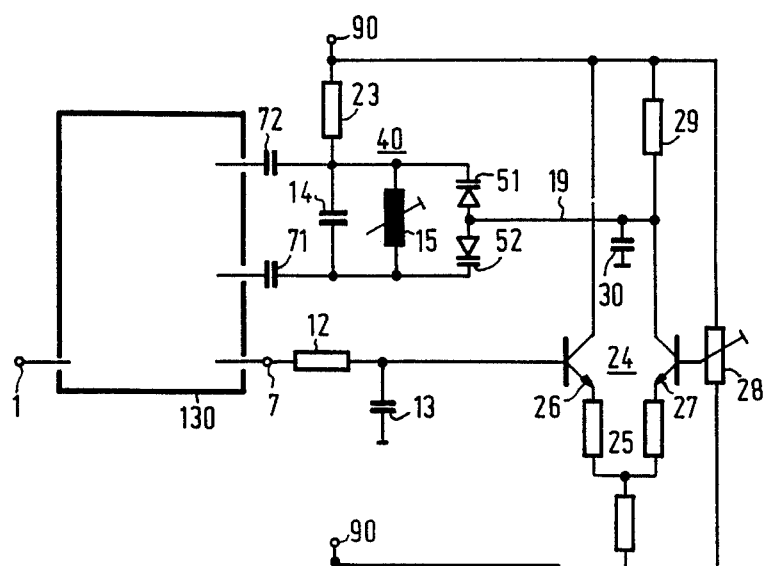
FIG. 5 shows a fourth embodiment of the invention which is a modification of the block diagram of FIG. 4.
Figure 6:
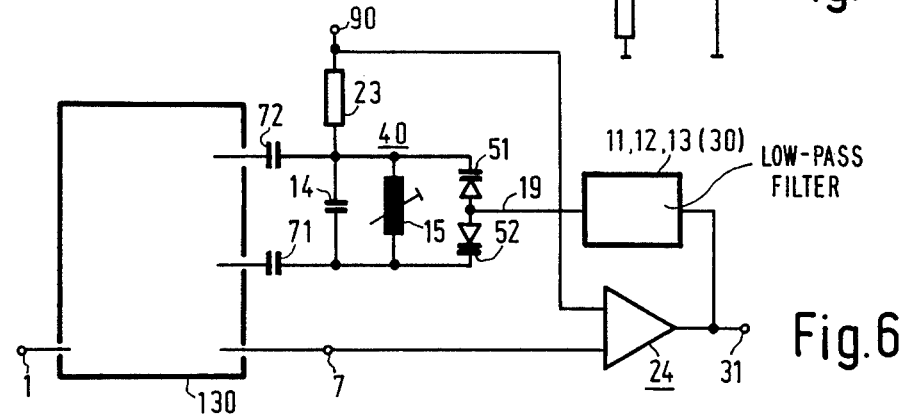
FIG. 6 shows a fifth embodiment of the invention which is a modification of the block diagram of FIG. 5.

FIGS. 4 to 6 show further embodiments in which elements from FIG. 3 have identical reference numerals. Particularly the circuit parts enclosed by the line 130 in FIG. 3 are identical in the arrangements shown in FIGS. 4 to 6.

In the arrangement according to FIG. 4, a modified filter circuit 40 is used which, in addition to the described wave trap comprising the capacitance 14 and the inductance 15, has two series capacitors 71, 72 which do not only lead to the transmission minimum in the band-pass curve of the filter circuit 40 but also to its d.c. separation from the arrangement enclosed by line 130. Furthermore two oppositely series-arranged capacitance diodes 51, 52 are arranged in parallel with the capacitance 14 of the wave trap, these diodes constituting tunable capacitances. A central tapping 19 between the two capacity diodes 51, 52 receives the control signal voltage for a fine tuning of the resonance frequency of the filter circuit 40. The filter circuit 40 is connected to a d.c. terminal 90 via a series resistor 23. Between the central tapping 19 and the d.c. terminal 90, the capacity diodes 51, 52 are equally reverse-biassed in conformity with the control voltage at the central tapping 19 and thus their capacitance is adjusted. The control voltage at the central tapping 19 thereby determines the resonance frequency of the wave trap 14, 15, 51, 52. If the filter circuit 40 is detuned, i.e. in the case of a deviation of the resonance frequency of the wave trap 14, 15, 51, 52 from the frequency of the reference signal or the picture carrier signal due to ageing processes, manufacturing tolerances or also due to a wanted fractional detuning of a preceding receiver arrangement for subjective picture improvement (so-called "sharp tuning") the resonance frequency can be adjusted to the frequency of the reference signal by a corresponding adjustment of the control voltage at the central tapping 19. Advantageously, the control voltage is a measure of the described deviation. The control voltage then causes the resonance frequency of the filter circuit 40 to track the frequency of the reference signal.

A very simple example of generating the control voltage is also shown in FIG. 4. It can be used particularly when the reference signal is substantially shifted 90° in phase with respect to the picture carrier signal. In addition to other signals the mixer stage 5 then supplies from its output 7 a d.c. voltage mixing product whose value is directly dependent on the deviation between the resonance frequency of the filter circuit 40 and the frequency of the reference signal. The control voltage is then preferably derived as this d.c. voltage mixing product from the mixer stage, more specifically according to FIG. 4, similarly as in FIG. 3 via the low-pass filter comprising two series resistors 11, 12 and the shunt capacitance 13. The low-pass filter 11, 12, 13 serves for suppressing the influence of the sound signal from the output 7 on the filter circuit 40.

The arrangement of two series capacitors 71, 72 in the filter circuit 40 has the advantage that a symmetrical filter circuit arrangement is attained therewith, although two capacitors (with a double capacitance) are required for this purpose.

The arrangement of the filter circuits 2 and 40 according to FIGS. 3 and 4, respectively, represents one of a plurality of dual or equivalent circuit modifications all of which can be equally used for the circuit arrangement according to the invention. These dual or equivalent embodiments can be conceived by those skilled in the art in accordance with simple network-theoretical rules and will therefore not be further described.

FIG. 5 shows a modification of the arrangement of FIG. 4 in which elements already described have identical reference numerals. As compared with FIG. 4 the arrangement of FIG. 5 incorporates an amplifier 24 constituting a proportional control member via which the control voltage is applied from the output 7 of the mixer stage 5 to the filter circuit 40. The control voltage is to this end also passed through a low-pass filter constituted by the series resistor 12 and the shunt capacitance 13. The amplifier 24 comprises two transistors 26, 27 which are emitter-coupled via an emitter resistance network 25 comprising three resistors, one transistor 26 receiving the control voltage at its base terminal and the other transistor 27 receiving at its base terminal a d.c. bias voltage taken from the d.c. terminal 90 via a resistance voltage divider 28. The collector terminals of the transistors 26, 27 are connected to the d.c. terminal 90 directly, on the one hand, and via a collector resistor 29, on the other hand. The amplified control voltage is applied to the central tapping 19 from the junction point of the collector resistor 29 and the collector terminal of the transistor 27. A filter capacitor 30 is used for short-circuiting residual a.c. components in the control voltage at the central tapping 19.

The proportional control in the above-described arrangements ensures that the control voltage is a measure of the frequency deviation when controlling the deviation of the resonance frequency with respect to the frequency of the reference signal, thus enabling a simple adjustment in the manufacturing process and having a simple structure. It is found that this simple direct control also works adequately in the case of a remaining control error. If instead a more exact control for eliminating the control error is to be used, for example an integral control, a more elaborate generation of the control voltage is required.

FIG. 6 shows a modification of the arrangement according to FIG. 5 in which the amplifier 24 precedes the low-pass filter 11, 12, 13 and possibly 30 and thereby additionally constitutes an output amplifier for the sound signal. The elements correspond to those in FIG. 5 and are therefore shown for the greater part in a block-schematic diagram. The amplifier 24 has an output 31 from which the amplified sound signal difference frequency signal and the amplified d.c. mixing product can be taken. The latter is applied to the central tapping 19 via the low-pass filter 11, 12, 13 and possibly 30.

In a modification—not shown—of the arrangements according to FIGS. 5 and 6, the amplifier 24 receives a temperature-compensated direct bias voltage such that the control voltage at the central tapping 19 is independent of the temperature. Consequently, influences of thermal effects on the transmission properties of the demodulation arrangement are avoided. Particularly the resistance voltage divider 28 is replaced by a voltage divider provided with a temperature compensation. It preferably comprises one or more diodes or transistors arranged as diodes.

Furthermore central tapping 19 and d.c. terminal 90 in the arrangements according to FIGS. 4, 5 or 6 can be interchanged in such a way that the direct voltage is applied from the d.c. terminal 90 via the series resistor 23 to the central tapping 19 and the control voltage is instead applied via the point of the filter circuit 40 to which the direct voltage is applied via the series resistor 23 in the arrangements shown.

In a further modification of FIGS. 4, 5 or 6 the d.c. terminal 90, the associated series resistor 23 and the series capacitor 72 may be dispensed with if the d.c. voltage supply is instead provided by the circuit components enclosed by the line 130, particularly via the collector resistor 16 according to FIG. 3.

In a further advantageous embodiment the series capacitors 71, 72, the capacity diodes 51, 52, the amplifier 24 with the associated circuitry and possibly the low-pass filter 11, 12, 13 (possibly 30) may be integrated on the same semiconductor crystal, in addition to the circuit components enclosed by the line 130.

We claim:

1. A synchronous demodulator for demodulating a carrier signal modulated with a useful signal, said demodulator comprising a filter circuit for selecting the carrier signal, a limiter for generating an amplitude-limited reference signal from the carrier signal, a phase shifter for shifting the phase of the reference signal through a phase angle of essentially 90° with respect to the carrier signal, and a multiplier for multiplicatively combining the modulated carrier signal with the phase shifted reference signal, characterized in that a direct voltage supplied as a mixing product by the multiplier as a measure of the frequency deviation of the carrier signal from the pass frequency of the filter circuit is applied as a variable to this filter circuit for the purpose of controlling the pass frequency.

2. A synchronous demodulator as claimed in claim 1, characterized in that said demodulator further comprises, a further multiplier to which the reference signal is applied in phase with the modulated carrier signal for demodulating the baseband useful signal.

3. A synchronous demodulator as claimed in claim 1 or 2, characterized in that the filter circuit includes a tunable element to which the direct voltage is applied as a control voltage for controlling the pass frequency.

4. A synchronous demodulator as claimed in claim 3, characterized in that the tunable element comprises at least one tunable capacitance.

5. A synchronous demodulator as claimed in claim 3, characterized in that the control voltage is applied to the filter circuit from the output of the multiplier via a low-pass filter and an amplifier constituting a proportional control member.

6. A synchronous demodulator as claimed in claim 5, characterized in that the amplifier precedes the low-pass filter and additionally constitutes an output amplifier for the useful signal.

7. A synchronous demodulator as claimed in claim 5, characterized in that a temperature-compensated direct voltage is applied to the amplifier in such a way that the control voltage is independent of the temperature.

8. A synchronous demodulator as claimed in claim 1, for gaining at least one sound signal from a television signal which comprises an amplitude-modulated picture carrier signal and at least one modulated sound carrier signal, characterized in that the filter circuit has a transmission minimum (zero) at the frequency of the sound carrier.

9. A synchronous demodulator as claimed in claim 8, in which the filter circuit comprises a wave trap which shunts an operating impedance of a pre-amplifier, characterized in that the transmission minimum is constituted by at least one series capacitor arranged in series with the wave trap.

10. A synchronous demodulator as claimed in claim 9, characterized in that it is integrated on a semiconductor crystal together with the amplifier and, the at least one series capacitor.

* * * * *